(12) United States Patent
Xu et al.

(10) Patent No.: US 7,999,633 B2
(45) Date of Patent: Aug. 16, 2011

(54) EMI FILTER WITH AN INTEGRATED STRUCTURE OF COMMON-MODE INDUCTORS AND DIFFERENTIAL-MODE CAPACITORS REALIZED BY FLEXIBLE PRINTED CIRCUIT BOARD

(75) Inventors: Dehong Xu, Hangzhou (CN); Xiao-feng Wu, Hangzhou (CN); Yanjun Zhang, Hangzhou (CN); Yi Chen, Hangzhou (CN); Yasuhiro Okuma, Tokyo (JP); Kazuaki Mino, Hino (JP)

(73) Assignees: Fuji Electric Systems Co., Ltd., Tokyo (JP); Zhe Jiang University, Zhejiang Province (CN)

( * ) Notice: Subject to any disclaimer, the term of this patent is extended or adjusted under 35 U.S.C. 154(b) by 67 days.

(21) Appl. No.: 12/289,917

(22) Filed: Nov. 6, 2008

(65) Prior Publication Data

US 2009/0128258 A1    May 21, 2009

(30) Foreign Application Priority Data

Nov. 8, 2007 (CN) .......................... 2007 1 0156548
Dec. 27, 2007 (CN) .......................... 2007 1 0164854

(51) Int. Cl.
*H01F 5/00* (2006.01)
*H03H 7/00* (2006.01)

(52) U.S. Cl. ........ 333/177; 333/181; 333/185; 336/200; 336/206

(58) Field of Classification Search .................... 333/12, 333/177, 181, 185; 336/200, 206, 232, 234, 336/69, 131, 145, 147, 180, 185, 196, 221, 336/223

See application file for complete search history.

(56) References Cited

U.S. PATENT DOCUMENTS

| | | | | | |
|---|---|---|---|---|---|
| 2,521,513 | A | * | 9/1950 | Gray .............................. | 323/355 |
| 3,616,039 | A | * | 10/1971 | Hutzler et al. ................. | 156/254 |
| 4,368,407 | A | * | 1/1983 | Wroblewski ................... | 315/291 |
| 5,153,812 | A | * | 10/1992 | Naito ............................. | 361/270 |
| 5,337,028 | A | * | 8/1994 | White ........................... | 333/181 |
| 5,367,275 | A | * | 11/1994 | Esaki et al. ................... | 333/184 |
| 5,731,666 | A | | 3/1998 | Folker et al. | |
| 6,831,545 | B2 | * | 12/2004 | Karbula ......................... | 336/212 |
| 7,671,713 | B2 | * | 3/2010 | Xu et al. ....................... | 336/185 |

FOREIGN PATENT DOCUMENTS

CN    2097476 U    2/1992

OTHER PUBLICATIONS

Chen et al., "Integration of EMI Filter for Distributed Power System (DPS) Front-end Converter", IEEE, pp. 296-300, 2003.
Chen et al., "Planar Electromagnetic Integration Technologies for Integrated EMI Filter", IEEE, 2003.
Biela et al., "Passive and Active Hybrid Integrated EMI Filters", IEEE, pp. 1174-1180, 2006.

* cited by examiner

*Primary Examiner* — Robert Pascal
*Assistant Examiner* — Kimberly E Glenn
(74) *Attorney, Agent, or Firm* — Rabin & Berdo, PC

(57) ABSTRACT

An integrated structure of common-mode inductors and differential-mode capacitors in an EMI filter realized using a flexible circuit board, including: a closed magnetic circuit formed by a first magnetic core and a second magnetic core, optionally including an air gap formed in a middle pillar of the magnetic cores, and with a flexible printed circuit board (FPC) wound on at least one pillar, the FPC formed by laminating alternating insulating and copper foil layers. The integrated structure of inductors and capacitors is advantageous in reducing the volume of the EMI filter and improving the power density of an electronic power transformer.

11 Claims, 5 Drawing Sheets

EMI FILTER WITH AN INTEGRATED STRUCTURE OF COMMON-MODE INDUCTORS AND DIFFERENTIAL-MODE CAPACITORS REALIZED BY FLEXIBLE PRINTED CIRCUIT BOARD

CROSS REFERENCE TO RELATED APPLICATIONS

This application claims priority from Chinese patent application serial number 200710156548.5, filed on Nov. 8, 2007 and published on Jun. 25, 2008 as CN 101206947A, and from Chinese patent application serial number 200710164854.3, filed on Dec. 27, 2007, the entire disclosures of each of which are incorporated herein by reference.

FIELD OF THE INVENTION

The present invention relates to an integrated structure of passive components. More specifically, it relates to an EMI (electromagnetic interference) filter including an integrated structure of inductors and capacitors realized using a flexible printed circuit board (FPC), and especially to integrated common-mode (CM) inductors and differential-mode (DM) capacitors.

DESCRIPTION OF THE BACKGROUND

Currently, the trend in electric and electronic equipment is modularization and miniaturization, and this trend demands the miniaturization of each electronic component in the equipment to as small a size as possible. As an indispensable component in many pieces of equipment, a conventional EMI filter usually consists of a large quantity of discrete components of large size, so it has become one of the bottlenecks in the process of further miniaturization of electric and electronic equipment.

SUMMARY

An object of the present invention is to provide an integrated structure of inductors and capacitors, particularly integrated common-mode inductors and differential-mode capacitors, in an EMI filter realized by a flexible circuit board, so as to reduce the size of the filter.

Integrated common-mode inductors and differential-mode capacitors are realized by flexible printed circuits in an EMI filter including a closed magnetic circuit that consists of a first magnetic core and a second magnetic core. More than one magnetic core pillar is formed by the first and second magnetic cores, where at least one of the magnetic core pillars is wound with a tubular multi-layer serially connected FPC. The FPC is formed by laminating a top insulating layer, 2N copper-foil layers, 2N−1 insulating medium layers, and a bottom insulating layer, where an insulting medium layer is placed between every two neighboring copper-foil layers (N≧1). The copper-foil layers that have an odd layer number are connected to each other on their head and tail ends, respectively, while the other copper-foil layers that have an even layer number are also similarly connected.

In the present invention, the closed magnetic circuit may have three magnetic-core pillars. In an alternate embodiment, it may have two magnetic core pillars. A closed magnetic circuit of three magnetic core pillars is formed by two magnetic cores of an "E" shape, or by one magnetic core of an "E" shape and one magnetic core of an "I" shape. A closed magnetic circuit of two magnetic core pillars is formed by two magnetic cores of a "U" shape, or by one magnetic core of a "U" shape and one magnetic core of an "I" shape.

In the present invention, an insulating medium layer is made of a flexible dielectric material for a capacitor, such as an organic thin film.

In the present invention, all even-numbered copper-foil layers of a tubular multi-layer serially connected FPC electrically couple with all odd-numbered copper-foil layers through the insulating medium layers in between, so as to form differential-mode capacitors in an EMI filter. At the same time, all even-numbered copper-foil layers couple with all odd-numbered copper-foil layers through the closed magnetic field to form common-mode inductors in the EMI filter. Using a multi-layer serially connected FPC enables an increase in the capacitance of the differential-mode capacitors in the EMI filter without increasing the length of the windings.

The integrated structure of inductors and capacitors realized by a flexible circuit board in the EMI filter according to a further embodiment of the present invention comprises a closed magnetic circuit of a tri-pillar magnetic core formed by a first magnetic core and a second magnetic core, where there is an air gap in the middle magnetic core pillar of the closed magnetic circuit, and on each of the two side magnetic core pillars is respectively wound a tubular double-faced flexible circuit board, which tubular double-faced flexible circuit board is formed by laminating a first insulating layer, a first copper foil, an insulating medium layer, a second copper foil and a second insulating layer, and at a head end and a tail end of the first copper foil and at the tail end of the second copper foil are respectively welded with pads for connecting with an external circuit.

In the integrated structure of inductors and capacitors passive-elements according to this embodiment, the first copper foil, the insulating medium layer and the second copper foil of the tubular double-faced flexible circuit board form a common-mode capacitor in the EMI filter; the coupling inductor formed by two tubular double-faced flexible circuit boards through the side magnetic core pillars form a common-mode inductor in the EMI filter; and the inductor formed by two tubular double-faced flexible circuit boards through the magnetic circuit formed by the side magnetic core pillars they are wound on and the middle magnetic core pillar with the air gap form a differential-mode inductor in the EMI filter, wherein the differential-mode inductance of the EMI filter can be regulated by adjusting the length of the air gap in the middle magnetic core pillar.

In the present invention, common-mode inductors and differential-mode capacitors are integrated in the EMI filter by using an FPC. Because an FPC is flexible and can be easily wound onto a magnetic core pillar, common-mode inductors and differential-mode capacitors can be integrated. The capacitance of the differential-mode capacitors can be increased by using a tubular multi-layer serially connected FPC. The present invention helps to further miniaturize EMI filters, and to increase the power density of electric or electronic power transformers.

DETAILED DESCRIPTION

The present invention is further explained below with reference to the accompanying drawings.

Figure 1:
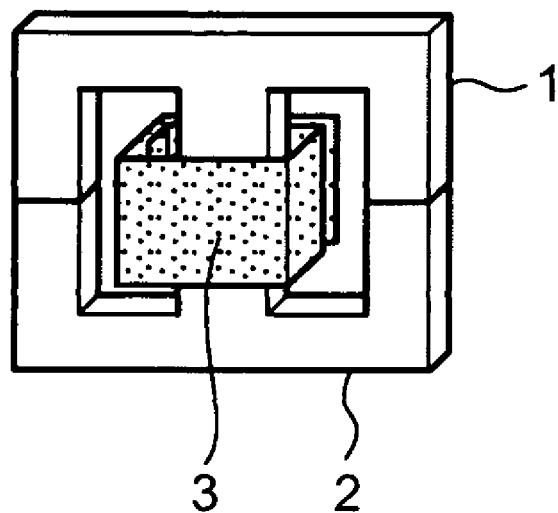
FIG. 1 shows a first embodiment of the present invention.

As illustrated in FIG. 1, the integrated common-mode inductors and differential-mode capacitors in a first embodiment of the present invention include a closed magnetic circuit consisting of a first magnetic core 1 and a second magnetic core 2. The first magnetic core 1 and the second magnetic core 2 are both of an "E" shape in FIG. 1 to form a closed magnetic circuit of three magnetic core pillars. In an alternate embodiment, one of the magnetic cores can be of an "E" shape while the other is of an "I" shape, so as to form another closed magnetic circuit of three magnetic core pillars. The central one of the three magnetic core pillar is wound by a tubular multi-layer serially connected FPC 3.

Figure 2:
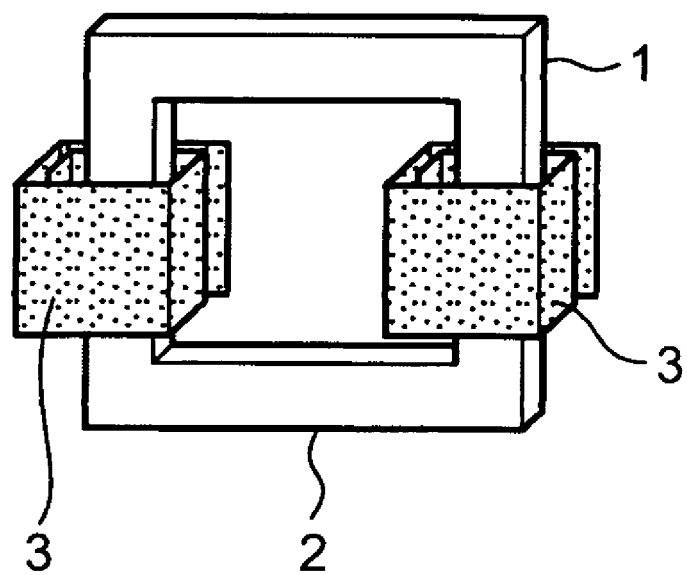
FIG. 2 shows a second embodiment of the present invention.

FIG. 2 illustrated integrated common-mode inductors and differential-mode capacitors in a second embodiment of the present invention, which include a closed magnetic circuit that consists of a first magnetic core 1 and a second magnetic core 2. The first magnetic core 1 and the second magnetic core 2 are both of a "U" shape in FIG. 2 to form a closed magnetic circuit of two magnetic core pillars. In an alternate embodiment, one of the magnetic cores can be of a "U" shape while the other is of an "I" shape, so as to form another closed magnetic circuit of two magnetic core pillars. Each magnetic core pillar is wound with a respective tubular multi-layer serially connected FPC 3.

Figure 3:
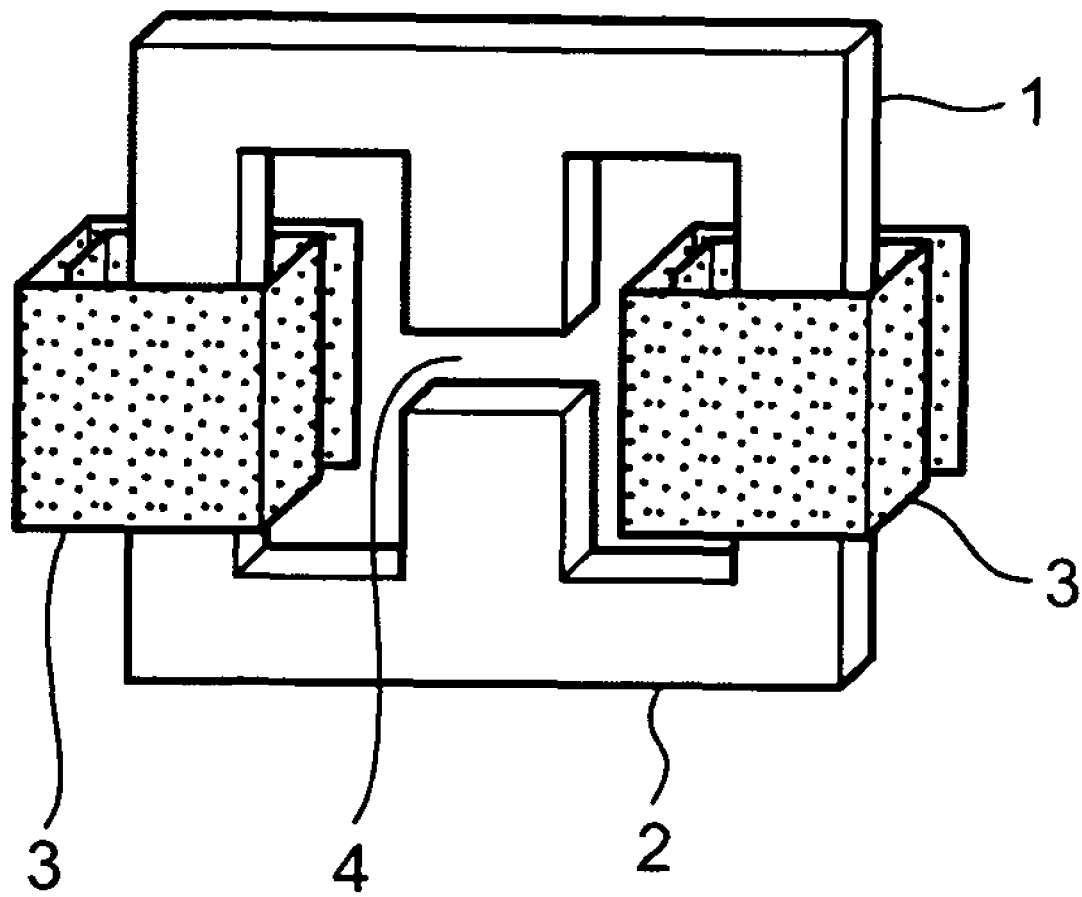
FIG. 3 shows a third embodiment of the present invention.

Referring to FIG. 3, the integrated structure of inductors and capacitors in the EMI filter realized by a flexible circuit board according to a third embodiment of the present invention comprises: a closed magnetic circuit of a tri-pillar magnetic core formed by a first magnetic core 1 and a second magnetic core 2, in the example shown, the first magnetic core 1 and the second magnetic core 2 are both in E-shape, but it is also possible that one of them is in E-shape and the other is in I-shape, and together they form the closed magnetic circuit of a tri-pillar magnetic core. There is an air gap 4 in the middle magnetic core pillar, and on each of the two side magnetic core pillars is wound respectively with a tubular double-faced flexible circuit board 3.

Figure 4:
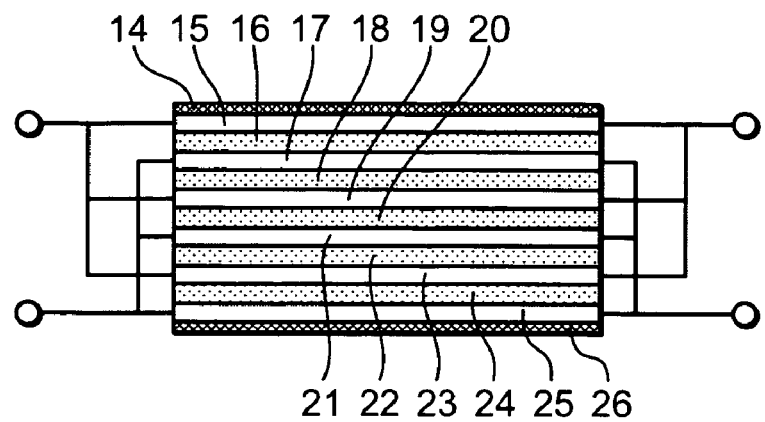
FIG. 4 is a cross-sectional view of board material for forming a tubular multi-layer serially connected FPC.

FIG. 4 is a cross-sectional view of board material for forming a tubular multi-layer serially connected FPC. There are 6 copper-foil layers (i.e. N=3) in the example shown in FIG. 4, although N can be any positive integer. The FPC is formed by wounding the board material that consists of alternately placed six copper-foil layers 15, 17, 19, 21, 23, 25 and five insulating medium layers 16, 18, 20, 22 and 24, laminated between a top insulating layer 14 and a bottom insulating layer 26. The copper-foil layers that have an odd layer number are connected on their head and tails ends, respectively, while the other copper-foil layers that have an even layer number are similarly connected.

Figure 5:
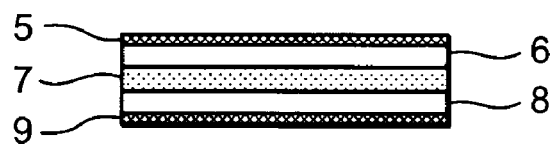
FIG. 5 is a cross-sectional view of board material for forming a tubular multi-layer serially connected FPC when N=1.
Figure 6:
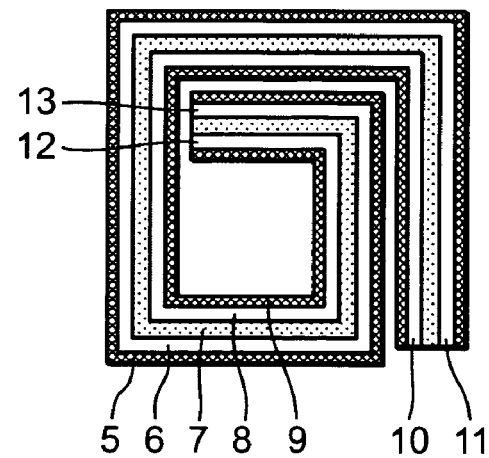
FIG. 6 is a top view of the tubular multi-layer serially connected FPC formed by the board material of FIG. 5.

FIG. 5 is a cross-sectional view of board material for forming a tubular multi-layer serially connected FPC when N=1. There are two copper-foil layers 6 and 8, and an insulating medium layer 7, between two insulating layers 5 and 9. FIG. 6 is a top view of the tubular multi-layer serially connected FPC formed using the board material in FIG. 5. In one embodiment of the present invention, a dielectric material for capacitors, organic thin films, can be used to form insulating medium layers 7. A separate pad connecting to an external circuit is welded to each of the head end 11 and the tail end 13 of the first copper-foil layer 6, and the head end 10 and the tail end 12 of the second copper foil layer 8.

In alternate embodiments, the tubular multi-layer serially connected FPC is wounded on a magnetic core pillar for one round, or for multiple rounds coaxially.

Figure 7:
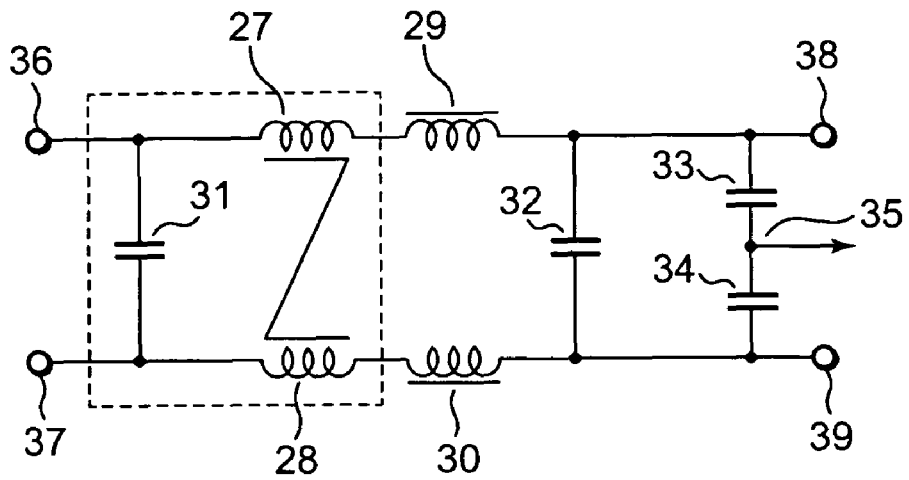
FIG. 7 is an equivalent schematic diagram of the EMI filter according to the first embodiment of the invention.

FIG. 7 is an equivalent schematic diagram of the first embodiment of the EMI filter, in which an equivalent circuit of the integrated common-mode inductors and differential-mode capacitors of FIG. 1 is shown in the dashed box. As shown in FIG. 1, the tubular multi-layer serially connected FPC forms two common-mode inductors and a differential-mode capacitor. A complete EMI filter can be built by the integrated common-mode inductors 27, 28 and differential-mode capacitor 31 of the present invention, together with external discrete common-mode capacitors 33 and 34, differential-mode inductors 29 and 30, and another external discrete differential-mode capacitor 32. In FIG. 6, the circuit is connected to ground at 35, and 36, 37, 38 and 39 are pads for connecting to external circuits.

Figure 8:
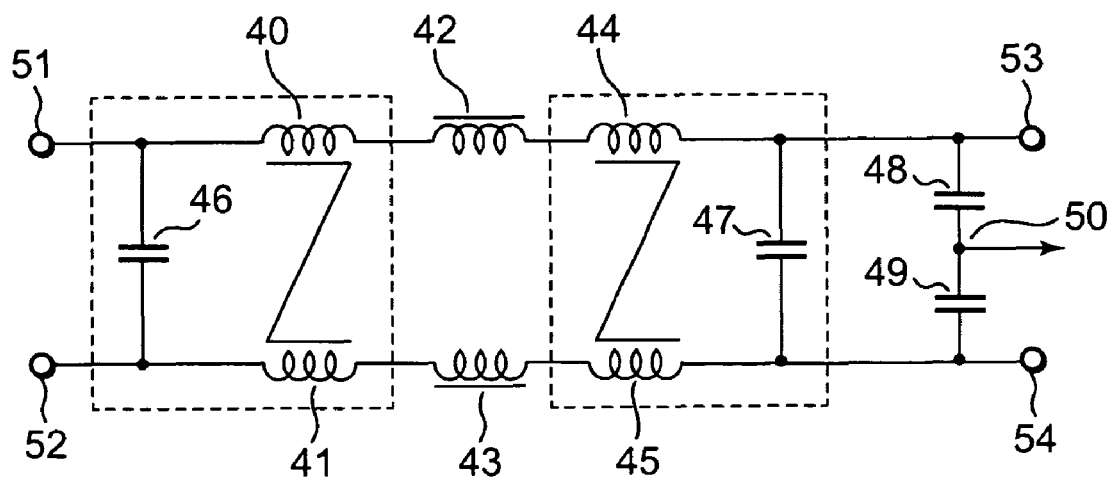
FIG. 8 is an equivalent schematic diagram of the EMI filter according to the second embodiment of the invention.

FIG. 8 is an equivalent schematic diagram of the second embodiment of the EMI filter, in which an equivalent circuit of the integrated common-mode inductors and differential-mode capacitors of FIG. 2 is shown in the dashed box. As shown in FIG. 2, each tubular multi-layer serially connected FPC forms two common-mode inductors and a differential-mode capacitor. A complete EMI filter can be built by the integrated common-mode inductors 40, 41, 44, 45 and differential-mode capacitors 46, 47 of the present invention, together with external discrete common-mode capacitors 48 and 49, and differential-mode inductors 42 and 43. In FIG. 8, the circuit is connected to ground at 50, and 51, 52, 53 and 54 are pads for connecting to external circuits.

Figure 9:
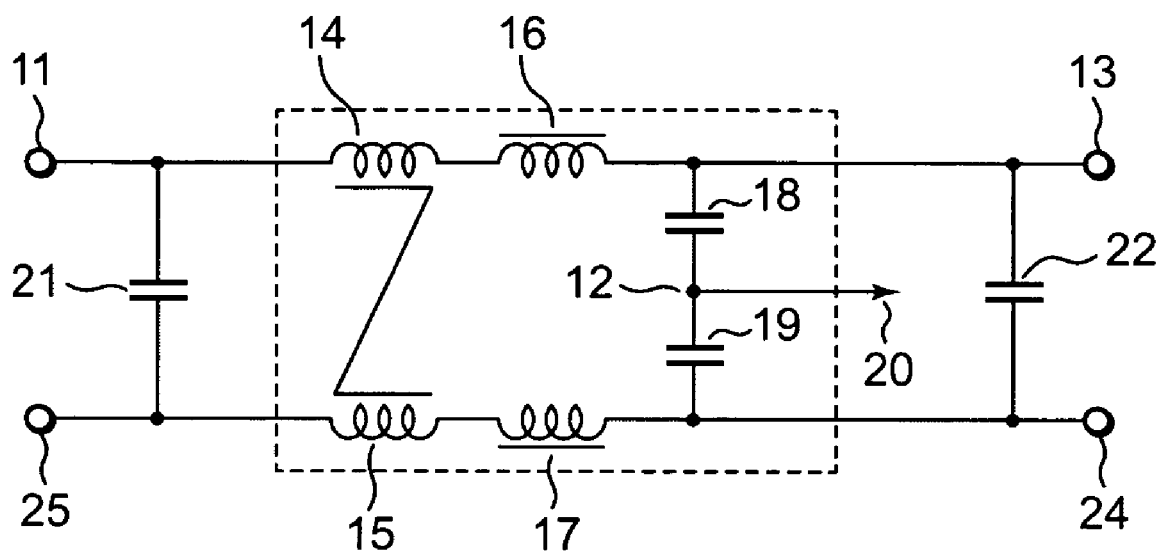
FIG. 9 is an equivalent schematic diagram of the EMI filter according to the third embodiment of the invention.

FIG. 9 is an equivalent schematic diagram of the third embodiment of the EMI filter, in which an equivalent circuit of the integrated structure of capacitor and inductor shown in FIG. 3 is in the dashed box, which adopts the present integrated structure to realize the common-mode inductors 14, 15, the differential-mode inductors 16, 17, and the common-mode capacitors 18, 19 which form a complete EMI filter together with additional discrete differential-mode capacitors 21, 22. The first copper foil, the insulating medium layer and the second copper foil of one tubular double-faced flexible circuit board 3 form the common-mode capacitor 18 in the EMI filter; the first copper foil, the insulating medium layer and the second copper foil of the other tubular double-faced flexible circuit board 3 form the common-mode capacitors 19 in the EMI filter; the tubular double-faced flexible circuit boards 3 form the common-mode inductors 14, 15 in the EMI filter by coupling the magnetic circuit formed through the side magnetic core pillars of the first magnetic core and the second magnetic core; one of the tubular double-faced flexible circuit boards 3 forms, via the inductance formed by the magnetic circuit formed the side magnetic core pillar it is wound on and the middle magnetic core pillar opened with the air gap, a differential-mode inductor 16; the other tubular double-faced flexible circuit board 3 forms a differential-mode inductor 17 via the inductance formed by the magnetic circuit formed through the side magnetic core pillar it is wound on and the middle magnetic core pillar opened with the air gap; and the differential-mode inductance can be regulated by adjusting the length of the air gap in the middle-pillar of the magnetic core. In this figure, 12 is connected to the earth, and 11, 13, 24, 25 are the welding pads for connecting with an external circuit.

It will be appreciated by those skilled in the art that the invention may be practiced otherwise than as specifically disclosed in the above preferred embodiments without departing from the scope thereof.

The invention claimed is:

1. An EMI (electromagnetic interference) filter with integrated inductors and capacitors realized using at least one flexible printed circuit (FPC), comprising:
    a closed magnetic circuit, formed by a first magnetic core and a second magnetic core, comprising a plurality of magnetic core pillars;
    at least one of the plurality of magnetic core pillars being wound with the at least one FPC, being a multi-layer serially connected FPC, wherein the at least one FPC is formed by laminating a top insulating layer, 2N copper-foil layers, 2N−1 insulating medium layers, and a bottom insulating layer, wherein N is a positive integer, one of the insulating medium layers is placed between every two neighboring copper-foil layers of the 2N copper-foil layers, and
    odd-numbered copper-foil layers of the 2N copper-foil layers are connected to each other on their head and tails ends, respectively, while even-numbered copper-foil layers of the 2N copper-foil layers are connected to each other on their head and tails ends, respectively.

2. The EMI filter of claim 1, wherein the first and second magnetic cores are both "E" shaped, such that the closed magnetic circuit comprising the plurality of magnetic core pillars consists of three magnetic core pillars.

3. The EMI filter of claim 1, wherein the first magnetic core is of an "E" shape and the second magnetic core is of an "I" shape, such that the closed magnetic circuit comprising the plurality of magnetic core pillars consists of three magnetic core pillars.

4. The EMI filter of claim 1, wherein the first and second magnetic cores are both of a "U" shape, such that the closed magnetic circuit comprising the plurality of magnetic core pillars consists of two magnetic core pillars.

5. The EMI filter of claim 1, wherein the first magnetic cores is of a "U" shape and the second magnetic core is of an "I" shape, such that the closed magnetic circuit comprising the plurality of magnetic core pillars consists of two magnetic core pillars.

6. The EMI filter of claim 1, wherein N=1.

7. The EMI filter of claim 1, wherein the insulating medium layers are made of a flexible dielectric material for at least one of the capacitors.

8. An EMI (electromagnetic interference) filter with integrated inductors and capacitors realized using at least one flexible printed circuit (FPC), comprising:
    a closed magnetic circuit of a tri-pillar magnetic core formed by a first magnetic core and a second magnetic core, wherein there is an air gap in a middle magnetic core pillar of the tri-pillar magnetic core of the closed magnetic circuit, and
    each of two side magnetic core pillars of the tri-pillar magnetic core is respectively wound with a tubular double-faced flexible circuit board comprising the at least one flexible printed circuit, the tubular double-faced flexible circuit board being formed in turn by a first outermost insulating layer, a first copper foil, an insulating medium layer, a second copper foil and a second outermost insulating layer, and at a head end and a tail end of the first copper foil and at a tail end of the second copper foil are respectively welded pads for connecting with an external circuit.

9. The EMI filter of claim 8, wherein the first magnetic core and the second magnetic core are both E-shaped, so as to form the closed magnetic circuit of the tri-pillar magnetic core.

10. The EMI filter of claim 8, wherein one of the first magnetic core and the second magnetic core is E-shaped, and the other is I-shaped, so as to form the closed magnetic circuit of the tri-pillar magnetic core.

11. The EMI filter of claim 8, wherein the insulating medium layer is an organic film capacitor medium material.

* * * * *